United States Patent [19]

Sakakibara

[11] Patent Number: 5,287,159
[45] Date of Patent: Feb. 15, 1994

[54] IMAGE FORMING APPARATUS HAVING A FUNCTION OF AUTOMATICALLY DETECTING AN ORIGINAL SIZE AND DIRECTION

[75] Inventor: Kenji Sakakibara, Ichinomiya, Japan
[73] Assignee: Brother Kogyo Kabushiki Kaisha, Nagoya, Japan
[21] Appl. No.: 630,187
[22] Filed: Dec. 19, 1990
[30] Foreign Application Priority Data
  May 16, 1990 [JP] Japan .................. 2-127761
[51] Int. Cl.$^5$ .......................... G03G 21/00
[52] U.S. Cl. ..................... 355/311; 355/208
[58] Field of Search ........... 355/311, 317, 243, 308, 355/309, 321, 208

[56] References Cited
U.S. PATENT DOCUMENTS

| | | | |
|---|---|---|---|
| 4,399,209 | 8/1983 | Sanders et al. | 430/138 |
| 4,406,537 | 9/1983 | Mori | 355/311 |
| 4,947,206 | 8/1990 | Ito | 355/243 X |
| 4,954,849 | 9/1990 | Koike et al. | 355/211 X |
| 5,003,493 | 3/1991 | Okada et al. | 355/311 X |
| 5,032,867 | 7/1991 | Nagata et al. | 355/68 |
| 5,036,354 | 7/1991 | Miyamoto | 355/75 |
| 5,070,324 | 12/1991 | Furushima | 340/706 |
| 5,077,581 | 12/1991 | Suzuki | 355/200 |
| 5,081,489 | 1/1992 | Ishikawa et al. | 355/200 |
| 5,132,722 | 7/1992 | Fujii | 355/27 |

Primary Examiner—Gerald P. Tolin
Assistant Examiner—Christopher Horgan
Attorney, Agent, or Firm—Oliff & Berridge

[57] ABSTRACT

An image forming apparatus having an image formation processing unit for forming an image of an original according to information carried by light reflected from the original. A plurality of paper feed cassettes are provided to accommodate plural kinds of output papers having different sizes or having longitudinal and transverse feed directions for papers of the same size. A selected one of the output papers is supplied from the selected paper feed cassette to the image formation processing unit, and the image of the original is thereafter formed on the selected output paper. At least two kinds of the output papers can be preliminarily selected, and simultaneously an enlarging or reducing magnification can be selected. When the original is set in position, a size and a direction of the original are detected, and an optimum one of the plural kinds of the output papers preliminarily selected is determined according to information of the detected size and direction of the original and information of the selected magnification. Thus, the optimum output paper is supplied to the image formation processing unit. Accordingly, an output image can be obtained on the optimum output paper of a desired size and direction with a desired magnification irrespective of the size and direction of the original.

31 Claims, 4 Drawing Sheets

IMAGE FORMING APPARATUS HAVING A FUNCTION OF AUTOMATICALLY DETECTING AN ORIGINAL SIZE AND DIRECTION

BACKGROUND OF THE INVENTION

1. Field of the Invention

The present invention relates to an image forming apparatus, and more particularly to an image forming apparatus having a function of automatically detecting an original size and direction.

2. Description of the Related Art

In a conventional image forming apparatus such as a copying machine having a function of automatically detecting an original size, when an output paper size is designated to be "A4 longitudinal", for example, an enlarging or reducing magnification is automatically performed according to an original size to copy an image of the original on the output paper having the "A4 longitudinal" size. This is known as an automatic magnification selecting function. The output paper size may be designated in one of two ways, that is, (1) by selecting a paper feed cassette (tray) to thereby designate an output paper contained in the cassette, and (2) by directly designating an output paper size. However, neither of these ways can designate a plurality of output papers or cassettes.

In the case where an output paper size is designated to be the "A4 longitudinal", and an original is set in a direction corresponding to "A4 transverse" with a magnification set to 100%, a proper copy cannot be obtained. Accordingly, a copying machine having the automatic original size detecting function is generally designed to sound an alarm and call a user's attention to change a setting direction of the original or an output paper size direction. As a result, the user must change the setting direction of the original or the output paper size, so as to obtain a proper copy.

Further, in another type of copying machine having an automatic original feeding device such as an ADF, the case arises that even when the sizes of the originals are not uniform, e.g., the originals include both the A4 size and the A3 size, all the output papers of A4 size are demanded. In this case, the automatic magnification selecting function is designated, and the output paper size is selected to "A4 longitudinal", thereby obtaining a proper copy image suitably automatically enlarged or reduced to the "A4 longitudinal" size from all of the originals having different sizes. However, as shown in FIG. 2, the originals of A3 and A4 sizes must be set such that the longitudinal directions thereof are aligned to each other with respect to the ADF of the copying machine 1. Accordingly, the original having a width smaller than that of the original of the A3 size which is a maximum size tends to be obliquely taken in by the ADF because of improper operation of an original guide. Further, in the case where the ADF is so designed as to require centering of the originals, it is very hard to properly set the originals, and the user is obliged to actually classify the sizes of the originals before copying.

SUMMARY OF THE INVENTION

Accordingly, it is an object of the present invention to overcome the above problems and to provide an image forming apparatus which can properly and simply form an image on an output paper of a desired size with a desired magnification irrespective of a setting direction and a size of an original.

The above and further objects and novel features of the invention will be achieved by an image forming apparatus comprising image formation processing means for forming an image of an original according to information carried by light reflected from the original; a plurality of paper feed cassettes for accommodating plural kinds of output papers having different sizes or having longitudinal and transverse feed directions for papers of the same size; means for supplying a selected one of the plural kinds of the output papers from the paper feed cassettes to the image formation processing means, the image of the original being formed on the selected output paper by the image formation processing means; paper designating means for designating the plural kinds of the output papers; original size/direction detecting means for detecting a size and a direction of the original; magnification selecting means for selecting an enlarging or reducing magnification of an output image with respect to the image of the original; and paper feed control means for controlling a paper feed to determine as the selected output paper an optimum output paper, the optimum output paper being selected from the plural kinds of the output papers designatable by the paper designating means.

BRIEF DESCRIPTION OF THE DRAWINGS

The invention will be described in detail with reference to the following drawings, wherein.

DETAILED DESCRIPTION OF THE PREFERRED EMBODIMENTS

A detailed description of a preferred embodiment of a color copying machine embodying the present invention will now be given with reference to the accompanying drawings.

Figure 1:
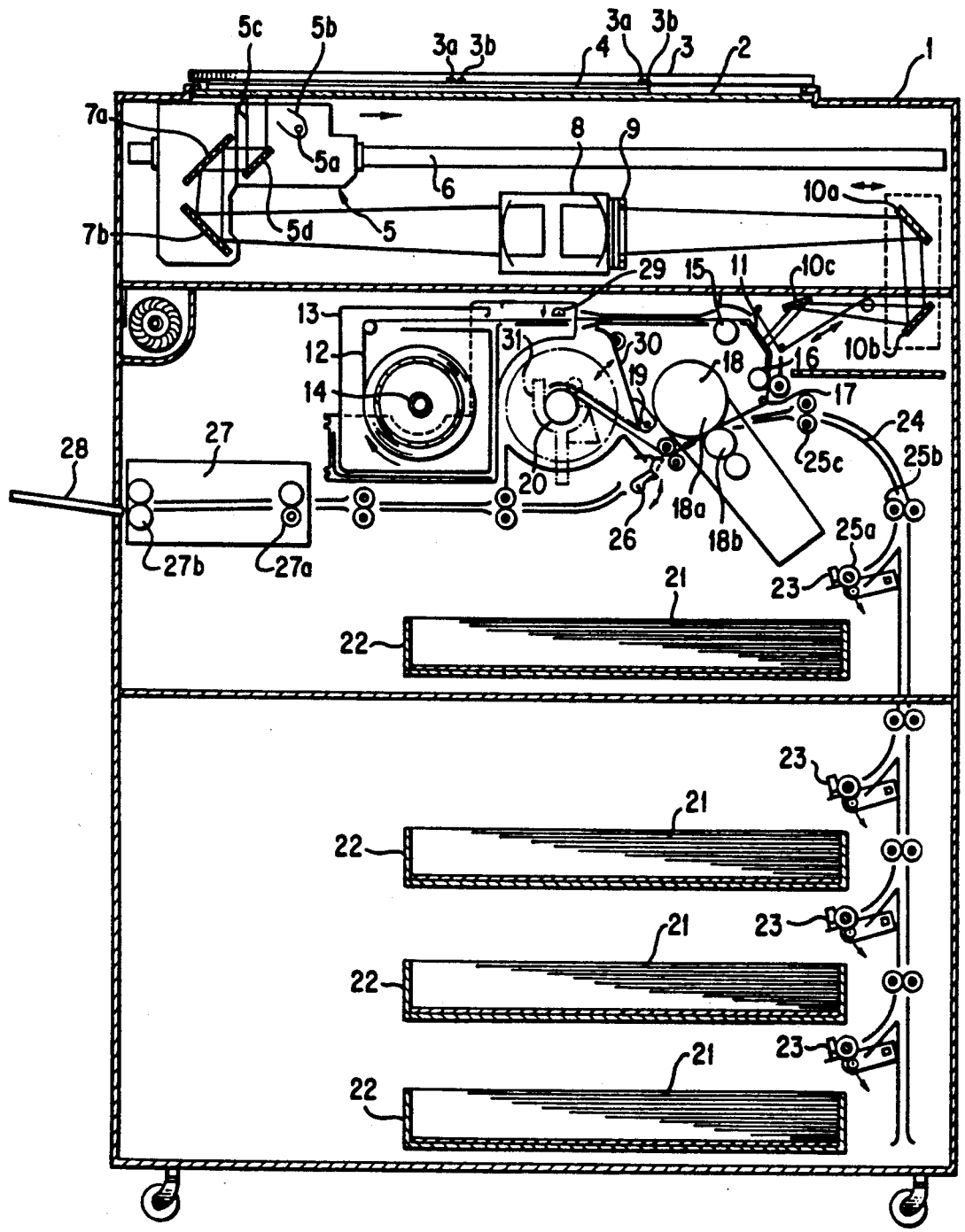
FIG. 1 is a vertical sectional view of a copying machine according to a preferred embodiment of the image forming apparatus of the present invention.
Figure 2:
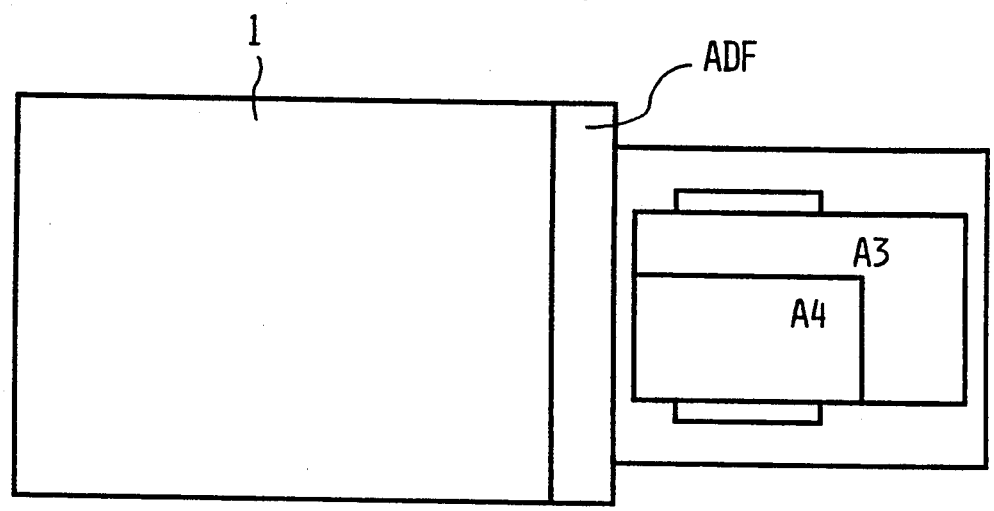
FIG. 2 is a top plan view of a prior art copying machine.

FIG. 1 shows a construction of a photosensitive pressure sensitive copying machine 1 according to a preferred embodiment. The copying machine 1 employs a photosensitive paper consisting of a photosensitive pressure sensitive paper 12 (which will be hereinafter referred to as a microcapsule paper) and a developer paper 21 (i.e., recording paper or imaging paper).

In the preferred embodiment, microcapsules are coated on a surface of a carrier of the microcapsule paper 12, and a color precursor or the like capable of reacting with a developer coated on a surface of a carrier of the developer paper 21 is contained in each of the microcapsules. The developer is adapted to react with the color precursor to effect coloring. This is described in U.S. Pat. No. 4,399,209, for example. Accordingly, a detailed explanation will be omitted hereinafter.

The copying machine 1 is provided at its upper end with an original glass plate 2 and an original cover 3. A desired original 4 is laid on the original glass plate 2, and the original cover 3 is closed. There is provided below the original glass plate 2 in the copying machine 1 a light source unit 5 including a halogen lamp 5a, reflectors 5b and 5c, and a reflecting mirror 5d. The light source unit 5 can be reciprocatingly moved along a shaft 6 extending in parallel to the original glass plate 2. The light source unit 5 is adapted to irradiate the original glass plate 2 by directing light on a line perpendicular to a moving direction of the light source unit 5. The irradiating light is transmitted through the original glass plate 2, and is then reflected by the original 4 laid on the original glass plate 2.

A mirror unit including reflecting mirrors 7a and 7b independent of the light source unit 5 is movably provided below the original glass plate 2. The reflected light from the original 4 is reflected onto the reflecting mirrors 5d, 7a and 7b, in this order, and is conducted in parallel to the moving direction of the light source unit 5. Further, there are provided below the original glass plate 2 a normally fixed projecting lens 8 and a filter 9 for adjusting a tone of a copy image. The reflected light from the reflecting mirror 7b enters the projecting lens 8. The projected light from the lens 8 is reflected onto reflecting mirrors 10a and 10b.

An exposure table 11 for exposing the microcapsule paper 12 is provided aside the reflecting mirror 10b, and a reflecting mirror 10c for changing an optical path is provided between the reflecting mirror 10b and the exposure table 11. The microcapsule paper 12 is located on the exposure table 11 so that image information from the original 4 may be formed on the microcapsule paper 12. The reflecting mirrors 10a and 10b are normally fixed. However, when a size of a latent image to be formed on the microcapsule paper 12 is intended to be enlarged or reduced, the reflecting mirrors 10a and 10b are integrally moved in the axial direction of the shaft 6, so as to change an optical path length in accordance with a change in projection magnification.

A cartridge 13 is replaceably mounted in the copying machine 1 at a central portion thereof, and the elongated microcapsule paper 12 wound around a cartridge shaft 14 is accommodated in the cartridge 13. When the cartridge 13 is set at a predetermined position in the copying machine 1, a leading end of the microcapsule paper 12 is drawn out toward the exposure table 11. A feeder roller 15 is provided before the exposure table 11, and a roller pair 16 and a dancer roller 17 for adjusting a tension are provided after the exposure table 11. A pressure developing device 18 including a large-diameter roller 18a and a backup roller 18b is provided on the downstream side of the dancer roller 17 with respect to a feeding direction of the microcapsule paper 12. A separation roller 19 for separating the microcapsule paper 12 from close contact with the developer paper 21 as will be hereinafter described is provided on the downstream side of the pressure developing device 18. A take-up shaft 20 for winding the microcapsule paper 12 is provided on the downstream side of the separation roller 19.

Thus, the microcapsule paper 12 drawn out of the cartridge 13 is guided by the feeder roller 15 to pass over the exposure table 11. Then, the microcapsule paper 12 is fed to pass through the dancer roller 17 and the pressure developing device 18. Then, the microcapsule ed from the developer paper 21 and thereafter wound around the take-up shaft 20. The microcapsule paper 12 drawn out of the cartridge 13 and not yet exposed to light is maintained under an unexposed condition by a light shielding cover.

A paper feed cassette 22 containing a plurality of sheets of the developer paper (copy paper) 21 is mounted in a body of the copying machine 1 under the pressure developing device 18. A suction-type paper feeding mechanism 23 for sucking the developer paper 21 by utilizing a vacuum is provided over the paper feed cassette 22. The sheets of the developer paper 21 contained in the paper feed cassette 22 are removed one-by-one for paper feeding by the operation of the paper feeding mechanism 23. A feed guide 24 and feed rollers 25a, 25b and 25c are provided between the paper feeding mechanism 23 and the pressure developing device 18, so that the developer paper 21 is fed by these members 24 and 25a to 25c to the pressure developing device 18.

On the downstream side of the separation roller 19 is provided a separation chute 26 adapted to be moved into a paper feeding path only upon initial auto-loading which will be hereinafter described, thereby guiding the leading end of the microcapsule paper 12 to the take-up shaft 20. A heat fixing device 27 including a heat roller 27a is provided on the downstream side of the separation chute 26, and a paper discharge roller 27b is provided on the downstream side of the heat fixing device 27. Further, a paper discharge tray 28 for receiving the developer paper 21 on which a developed image is formed is provided on the downstream side of the roller 27b.

The copying machine 1 further has an auto-loading function for automatically setting the microcapsule paper 12 in a predetermined feeding path in the body. This auto-loading function operates such that a leader film portion attached to the leading end of the microcapsule paper 12 is automatically drawn out into the paper feeding path, and is fed through the path to the take-up shaft 20. Accordingly, the microcapsule paper 12 continuing from the leader film portion is wound around the take-up shaft 20 to complete setting in the body. The auto-loading function is performed by the structure comprising a semi-circular roller 29 for drawing the leader film portion out of the cartridge 13, the above-mentioned separation chute 26, an upper winding guide 30 and a lower winding guide 31 for winding the leader film portion around the take-up shaft 20.

Further, the copying machine 1 is provided with original size reading means. The reading means comprises LED's 3a and optical sensors 3b provided on the original cover 3 as shown in FIG. 1. In the case that the copying machine 1 is provided with an ADF or the like, the reading means may be constructed such that a length of the original 4 during the course of feeding is measured to determine an original size.

The operation of the copying machine will now be described.

When the cartridge 13 is set in the copying machine 1, the auto-loading operation begins by winding the leading end of the microcapsule paper 12 around the take-up shaft 20. When the auto-loading operation is ended, the copying machine 1 is ready for a copying operation. When a copy start key (not shown) is depressed, the light source unit 5 including the reflecting mirror 5d is moved at a speed of 1/mV, and the reflecting mirrors 7a and 7b are moved at a speed of ½ mV, assuming that a feeding speed of the microcapsule paper 12 is represented by V and a projection magnification is represented by m. In this manner, the feeding speed of the microcapsule paper 12 is synchronous with the moving speeds of the reflecting mirrors 5d, 7a and 7b.

Therefore, a latent image of a given line on the original 4 is successively formed on the microcapsule paper 12 passing over the exposure table 11. The above speed ratio is preliminarily set according to a set value of the magnification.

The microcapsule paper 12 on which the latent image has been formed is fed by the roller pair 16, while an uppermost sheet of developer paper 21 in the paper feed cassette 22 suitably selected is fed by the paper feeding mechanism 23 and the feeder rollers 25a, 25b and 25c. The microcapsule paper 12 is then brought into close contact with the developer paper 21, and they are introduced together into the pressure developing device 18. In the pressure developing device 18, an inside surface of the microcapsule paper 12 on which the latent image is formed is in close contact with an inside surface of the developer paper 21 on which the developer is coated, and they are nipped under pressure between the large-diameter roller 18a and the backup roller 18b. As a result, the unexposed microcapsules on the microcapsule paper 12 are ruptured by the pressure to form a visible image on the developer paper 21.

The microcapsule paper 12 and the developer paper 21 discharged from the pressure developing device 18 are separated from each other by the separation roller 19. The separated developer paper 21 is fed to the heat roller 27a in the heat fixing device 27, in which the coloring is promoted to stabilize the image. Thereafter, the developer paper 21 is discharged to the paper discharge tray 28 by the paper discharge roller 27b. On the other hand, the separated microcapsule paper 12 is wound around the take-up shaft 20.

A paper stock unit is provided under the body of the copying machine 1. In the paper stock unit, a plurality of paper feed cassettes 22, each provided with a paper feeding mechanism 23 similar to that mounted in the body, are arranged in a vertical direction. These paper feed cassettes 22 contain a plurality of sheets of the developer paper 21 having various sizes. As will be described hereinafter, one of the paper feeding mechanisms 23 is suitably selected according to an output from a main control unit (control means) 61, and the developer paper 21 in the paper feed cassette 22 corresponding to the selected paper feeding mechanism 23 is fed to the paper developing device 18.

Figure 3:
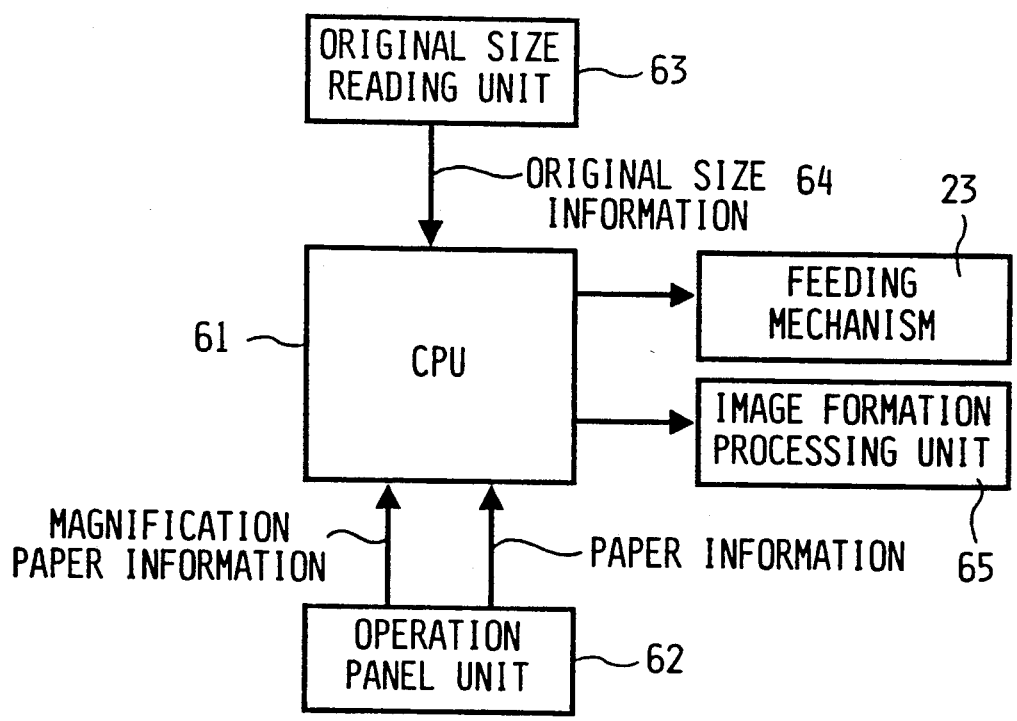
FIG. 3 is a block diagram of a control unit employed in the preferred embodiment.

FIG. 3 shows a construction of a control device for controlling the operation of the copying machine. The control device is provided with a main control unit 61 employing a CPU adapted to operate according to a predetermined program. The main control unit 61 inputs magnification information and paper information from an operation panel unit 62 and original size information 64 from an original size reading unit 63, and controls the paper feeding mechanism 23 and an image formation processing unit 65 so as to select an optimum paper and process image formation which will be hereinafter described.

Figure 4:
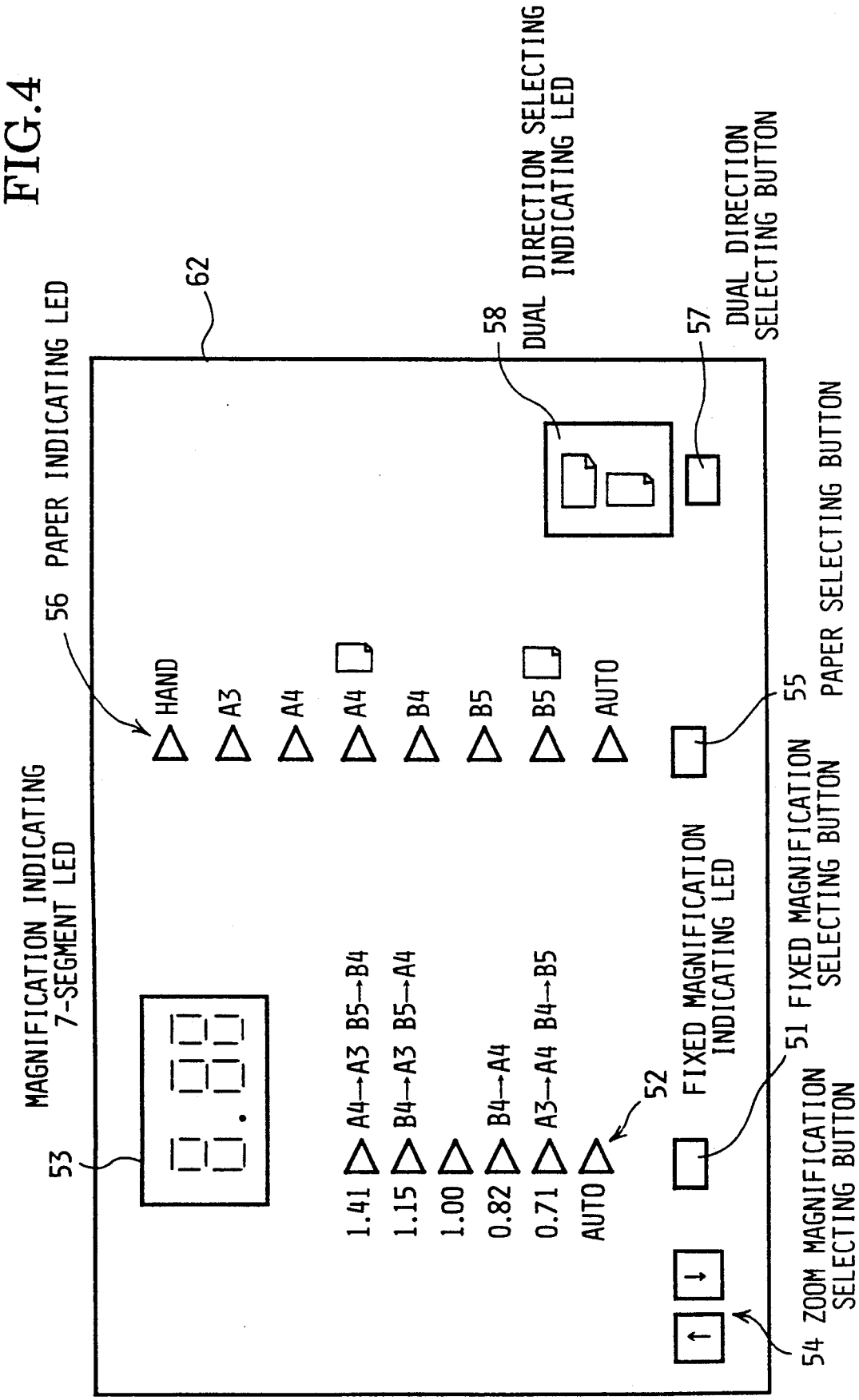
FIG. 4 is a plan view of an operation panel unit in the preferred embodiment.

The operation panel unit 62 of the copying machine 1 will now be explained with reference to FIG. 4. The operation panel unit 62 is provided with a magnification selecting left portion and a paper right portion.

The magnification selecting portion includes a fixed magnification selecting button 51, fixed magnification indicating LED's 52, magnification indicating 7-segment LED 53, and zoom magnification selecting button 54. Every time the fixed magnification selecting button 51 is depressed, the fixed magnification is successively changed. In cooperation therewith, an on-position of the fixed magnification indicating LED's 52 is successively shifted from an upper position to a lower position. The fixed magnification thus set is also indicated by the magnification indicating 7-segment LED 53. Further, the magnification can also be changed at a pitch of 1% by depressing the zoom magnification selecting button 54. This selected magnification is indicated by the magnification indicating 7-segment LED 53.

The paper designating portion includes a paper selecting or designating button 55, a dual direction selecting or designating button 57 and a dual direction selecting indicating LED 58. Every time the paper selecting button 55 is depressed, paper selection, or designation, can be successively changed. In cooperation therewith, an on-position of the paper indicating LED's 56 is successively shifted from an upper position to a lower position. Next to an "AUTO" position, a manual position "HAND" is turned on. Further, the dual direction selecting button 57 is provided to select both a longitudinal feed direction and a transverse feed direction of the same size paper selected by the paper selecting button 55. When the dual direction selecting button 57 is in an off-state, only one of the paper indicating LED's 56 is in an on-state. However, when the paper selecting button 55 is depressed, another paper having the same size as that of the previously selected paper but having a different feed direction can be additionally selected or designation and the two paper indicating LED's 56 corresponding to the selected papers having both the longitudinal and transverse feed directions are turned on. For example, it is assumed that "A4 longitudinal" (indicative of an A4 size paper having a longitudinal feed direction, labeled by "A4" without a mark on the panel) is selected at present. In this situation, when the dual direction selecting button 57 is depressed, "A4 transverse" (indicative of an A4 size paper having a transverse feed direction, labeled by "A4" with the mark on the panel) is additionally selected. Thus, both the "A4 longitudinal" and the "A4 transverse" are selected, and the corresponding two paper indicating LED's 56 are turned on. At the same time, the dual direction selection indicating LED 58 is also turned on.

Under the above condition, when an A4 size original is set on the original glass plate 2 so as to be oriented in the transverse feed direction, the original size is read by the original size reading unit 63, and the original size information is input into the main control unit 61. The main control unit 61 operates to select the "A4 transverse" paper as an optimum paper according to the magnification information (assuming that the magnification is 100%) and the paper size information (A4 longitudinal and A4 transverse), and control the image formation processing unit 65, thus processing the image formation. In contrast, when the original is set so as to be oriented in the longitudinal feed direction, the main control unit 61 operates to select the "A4 longitudinal" paper as an optimum paper and process the image formation.

When the dual direction selecting button 57 is depressed again to be turned off by an operator, the selection of the "A4 transverse" is canceled, and only the "A4 longitudinal" which was initially set is selected. Although the above description is directed to the case where the "A4 longitudinal" is initially selected, the operation is similarly carried out in the case where the "A4 transverse" is initially selected.

Further, it is assumed that the magnification is set to "AUTO", and the paper selected is both the "A4 longitudinal" and the "A4 transverse". In this case, when an original is set so as to be oriented in the longitudinal feed direction, the "A4 longitudinal" paper is automatically selected to carry out copying with a suitable enlarging or reducing magnification. In contrast, when the original is set so as to be oriented in the transverse feed direction, the "A4 transverse" paper is automatically selected to carry out copying with a suitable enlarging or reducing magnification.

Figure 5:
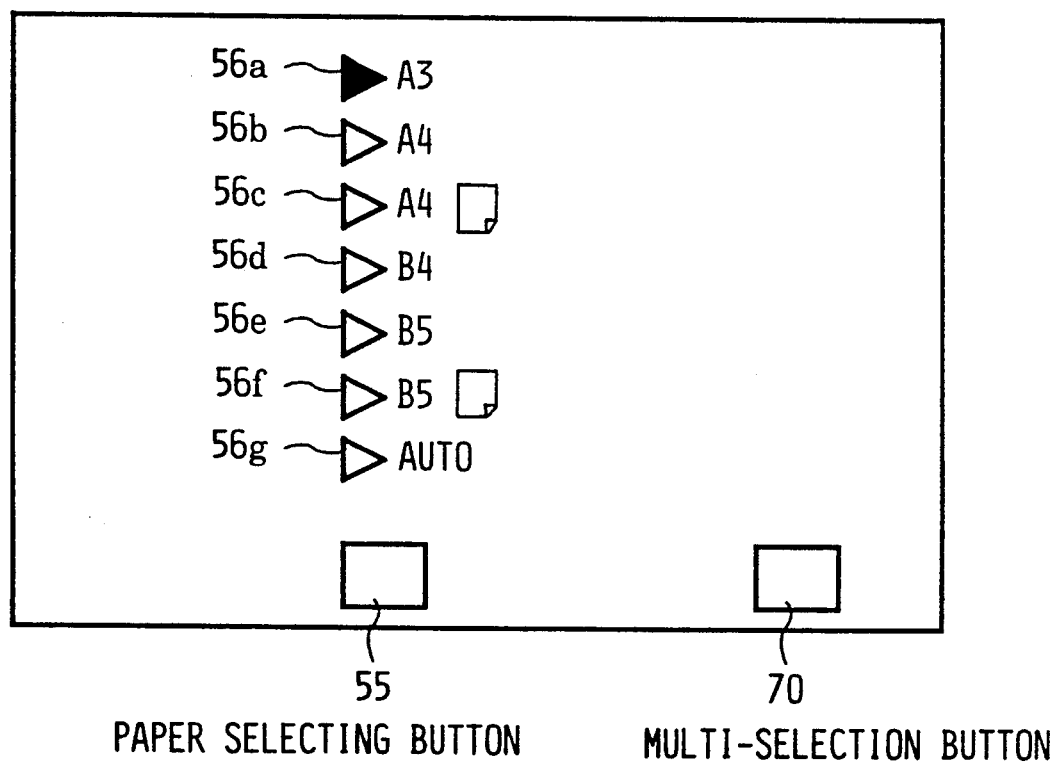
FIG. 5 is a plan view of an operation panel unit in another preferred embodiment.

In the above preferred embodiment, the description is particularly directed to the simultaneous selection or designation of both the longitudinal feed direction and the transverse feed direction of the same size paper. In addition, the following description can be directed to the simultaneous selection of papers having different sizes, the simultaneous selection being realized by providing a multi-selection button 70, as shown in FIG. 5. For example, upon selection of "A3", LED 56a corresponding to the "A3" is in an on-state. In this situation, when the paper selecting button 55 is once depressed and the multi-selection button 70 is depressed, the "A4 longitudinal" is additionally selected, and LED 56b corresponding to the "A4 longitudinal" is additionally turned on. Thus, both the "A3" and the "A4 longitudinal" can be selected. Thereafter, when the paper selecting button 55 is depressed again and the multi-selection button 70 is depressed, the previous selection of the "A4 longitudinal" is replaced by the selection of the "A4 transverse", and the previous on-state of the LED 56b is accordingly replaced by the on-state of LED 56c corresponding to the "A4 transverse". Under this condition, when the multi-selection button 70 is turned off (i.e., the depression of the button 70 is released), both the "A3" and the "A4 transverse" can be selected with both the LED's 56a and 56c being in the on-state.

Although it has been described above that the multi-selection button 70 can effect the simultaneous selection of plural kinds of papers having different sizes, the operation of the multi-selection button 70 is not limited to such paper selection. For example, the multi-selection button 70 can be similarly applied to simultaneous selection of plural magnifications. Furthermore, although two kinds of papers are simultaneously selected in the above preferred embodiment, three or more kinds of papers can be simultaneously selected according to the present invention.

As to the criterion of priority of selection of one of plural kinds of papers to be selected by the main control unit 61, it is preferable to preferentially select the following paper as a standard.

(1) Paper having the same feed direction (longitudinal or transverse) as the setting direction of an original.

(2) Paper on which an original can be copied with a magnification near 100%.

(3) Paper contained in the uppermost paper feed cassette. However, the control unit may be designed such that the above criterion of priority can be modified by a user.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An image forming apparatus comprising:
   image formation processing means for forming an image of an original according to information carried by light reflected from said original;
   a plurality of paper feed cassettes, each paper feed cassette accommodating one of a plurality of kinds of output papers, each of the plurality of kinds of output papers differing from the others of the plurality of kinds of output papers in at least one of a different size and a different direction;
   paper designating means for designating at least two kinds of output papers from said plurality of kinds of output papers;
   means for selecting an output paper to be supplied from said paper feed cassettes to said image formation processing means, the selected output paper being selected from said designated kinds of output papers;
   means for supplying the selected output paper from said paper feed cassettes to said image formation processing means, said image of said original being formed on said selected output paper by said image formation processing means;
   original size/direction detecting means for automatically detecting a size and a direction of said original when said original is in an image recording position;
   magnification selecting means for selecting at least one of an enlarging, reducing and 100% magnification of an image output from said image formation processing means with respect to said image of said original; and
   paper feed control means for controlling a paper feed to provide an optimum output paper as said supplied selected output paper, the optimum output paper being one of said at least two kinds of output papers designated by said paper designating means according to the selected magnification and the detected original size and direction.

2. The image forming apparatus according to claim 1, further comprising a photosensitive, pressure sensitive recording medium and wherein each of said plurality of kinds of output papers is a developer paper comprising a carrier and a developer carried on said carrier, said developer being capable of reacting with a color precursor contained in microcapsules carried on said photosensitive, pressure sensitive recording medium; and
   said image formation processing means comprises an exposing unit for exposing said photosensitive pressure sensitive recording medium to said light reflected from said original to thereby form a latent image of said original on said photosensitive pressure sensitive recording medium; a developing unit for superimposing under pressure said selected output paper with said photosensitive pressure sensitive recording medium on which said latent image is formed by said exposing unit to thereby form a visible image of said original on said selected output paper; and a fixing unit for heating said selected output paper on which said visible image is formed by said developing unit to thereby stabilize said visible image.

3. The image forming apparatus according to claim 2, wherein said exposing unit comprises light source means for irradiating said original with light, scan means for scanning said light source means along a surface of said original, lens means for converging said light reflected from a surface of said original as scanned by said scan means, and optical path length varying means for varying a projection magnification of said lens means.

4. The image forming apparatus according to claim 2, wherein said photosensitive pressure sensitive recording medium is a web-shaped recording medium, and said apparatus further comprises a cartridge for accommodating said web-shaped recording medium in an unused condition, and feeding means for removing said web-shaped recording medium from said cartridge, passing said web-shaped recording medium first through said exposing unit and then through said developing unit, separating said web-shaped recording medium from said selected output paper after passage through said developing unit, and winding said web-shaped recording medium around a take-up shaft.

5. The image forming apparatus according to claim 1, wherein said original size/direction detecting means comprises an LED for radiating light to an outer periphery of said original, and an optical sensor for detecting the light irradiated by said LED.

6. The image forming apparatus according to claim 1, further comprising an operation panel unit adapted to be operated by a user, wherein said magnification selecting means comprises a fixed magnification selecting button provided on said operation panel unit, and a magnification indicating LED for indicating a fixed magnification selected by said fixed magnification selecting button.

7. The image forming apparatus according to claim 6, wherein said magnification selecting means further comprises a zoom magnification selecting button for selecting a magnification at a pitch of 1%.

8. The image forming apparatus according to claim 1, further comprising an operation panel unit adapted to be operated by an user, wherein said paper designating means comprises a paper designating button provided on said operation panel unit, and a paper indicating LED for indicating at least two of said plurality of kinds of output paper said paper designated by said paper designating button.

9. The image forming apparatus according to claim 8, wherein the plurality of paper feed cassettes accommodates longitudinal direction output papers and transverse direction output papers for at least one of the plurality of different kinds of output papers and wherein aid paper designating means further comprises a dual direction designating button for designating both said longitudinal and transverse feed directions of said at least one kind of output paper when designated by said paper designating button.

10. The image forming apparatus according to claim 9, wherein when said magnification selected by said magnification selecting means is 100%, said paper feed control means operates to select one of said longitudinal and transverse feed directions designated by said dual direction designating button so that the selected feed direction accords with the direction of said original detected by said original size/direction detecting means.

11. The image forming apparatus according to claim 9, wherein when said magnification selected by said magnification selecting means is AUTO, said paper feed control means operates to select one of said longitudinal and transverse feed direction designated by said dual direction designating button so that the selected feed direction accords with the direction of said original detected by said original size/direction detecting means, and said magnification selecting means computes said enlarging or reducing magnification according to the size of said selected output paper and the size of said original detected by said original size/direction detecting means.

12. The image forming apparatus according to claim 8, wherein said paper designating means further comprises a multi-designation button provided on said operation panel unit for designating said plurality of kinds of output papers in cooperation with said paper designating button.

13. A method of forming an image in a image forming apparatus having an image formation processing means, comprising:
providing a plurality of kinds of output papers, each one of the plurality of kinds of output papers differing form the others of the plurality of kinds of output papers in at least one of a different size and a different direction;
automatically detecting the size and direction of an original when said original is in an image recording position;
selecting at least one of an enlarging, reducing and 100% magnification with respect to the original of an image to be output from the image formation processing means;
designating at least two kinds of output papers from the plurality of kinds of output papers;
selecting an optimum output paper from said at least two designated kinds of output papers according to the detected original size and direction and the selected magnification; and
supplying the selected optimum output paper selected from said at least two selected kinds of output papers.

14. The method as recited in claim 13, wherein each of said plurality of kinds of output papers comprise developer paper.

15. The method as recited in claim 13, wherein said paper designating step includes designating both longitudinal and transverse feed directions of each kind of designated output paper.

16. The method as recited in claim 13, wherein said paper designating step includes designating a feed direction in accordance with the direction of the original.

17. The method as recited in claim 16, wherein said magnification selecting step includes computing the enlarging or reducing magnification according to the size of the selected output paper and the size of the original.

18. An image forming apparatus comprising:
image formation processing means for forming an image of an original according to information carried by light reflected from the original;
a plurality of paper feed cassettes, each paper feed cassette accommodating a plurality of different output papers, the plurality of different output papers including at least one longitudinal feed direction paper and at least one transverse feed direction paper;
paper designating means for designating at least two of the plurality of different output papers;
means for selecting an output paper to be supplied form the paper feed cassettes to the image formation processing means, the selected output paper being selected from said designated different output papers;

means for supplying the selected output paper from the paper feed cassettes to the image formation processing means, the image of the original being formed on the selected output paper by the image formation processing means;

original size/direction detecting means for automatically detecting a size and a feed direction of the original; and paper feed control means for controlling a paper feed to provide an optimum output paper as the supplied selected output paper, wherein when the at least two different output papers designated by the paper designating means include at least one longitudinal feed direction output paper and at least one transverse feed direction output paper, the optimum output paper is one of the at least two designated different output papers such that the feed direction of the selected optimum paper accords with the detected feed direction of the original.

19. The image forming apparatus of claim 18, wherein when the at least two designated different output papers include at least two designated different output papers having feed directions according with the detected feed direction of the original, the optimum output paper is selected from the at least two designated different output papers such that the size of the selected optimum paper is at least equal to the detected size of the original.

20. The image forming apparatus of claim 19, wherein the optimum output paper is selected form the at least two designated different output papers such that he size of the selected optimum paper is closest to the detected size of the original.

21. The image forming apparatus of claim 18, wherein when the at least two designated different output papers include at least two designated different output papers having feed directions according with the detected feed direction of the original, the optimum output paper is selected from the at least two different output papers such that the size of the selected optimum paper is closest to the detected size of the original.

22. The image forming apparatus of claim 18, further comprising magnification selecting means for selecting a magnification value of an image output from said image formation processing means with respect to said image of said original, wherein when the at least two designated different output papers include at least two different output papers each having a feed direction according with the detected feed direction of the original, the optimum output paper is selected from the at least two different output papers such that the size of the selected optimum paper is based on the selected magnification value and the detected size of the original.

23. The image forming apparatus of claim 18, wherein when none of the at least two designated different output papers have feed directions according with the detected feed direction of the original, the optimum output paper is selected from the at least two designated different output papers such that the size of the selected optimum paper is sufficient for forming the output image based on the detected size of the original and a predetermined magnification value.

24. The image forming apparatus of claim 23, wherein the predetermined magnification value is 100%.

25. The image forming apparatus of claim 23, wherein when none of the at least two designated different output papers is sufficient for forming the output image based on the detected size of the original and the predetermined magnification value, the optimum output paper is designated based on which ones of the paper feed cassettes accommodate the at least two selected different output papers.

26. An image forming apparatus comprising:

image formation processing means for forming an output image of an original according to information carried by light reflected from the original;

a plurality of paper feed cassettes accommodating a plurality of different output papers, each of the different output papers having a size and a feed direction;

paper designating means for designating at least two of the plurality of different output papers;

means for selecting an output paper to be supplied from the paper feed cassettes to the image formation processing means, the selected output paper being selected from said plurality of different output papers;

means for supplying the selected output paper form the paper feed cassettes to the image formation processing means, the output image of the original being formed on the selected output paper by the image formation processing means;

original size/direction detecting means for automatically detecting a size and a feed direction of the original;

magnification selecting means for selecting at least one magnification value of the output image from said image formation processing means with respect to said image of said original; and paper feed control means for controlling a paper feed to provide an optimum output paper as the supplied selected output paper, wherein the optimum output paper is one of the at least two designated different output papers based on the at least one designated output papers based on the at least one selected magnification value and the detected size of the original.

27. The image forming apparatus of claim 26, wherein the optimum output paper is selected such that the size of the selected optimum output paper is sufficient for forming the output image based on the detected size of the original and one of the at least one magnification value.

28. The image forming apparatus of claim 26, wherein the optimum output paper is selected such that the size of the selected optimum output paper is sufficient for forming the output image based on the detected size of the original and a predetermined magnification value.

29. The image forming apparatus of claim 28, wherein the predetermined magnification value is 100%.

30. The image forming apparatus of claim 28, wherein when none of the at least two designated different output papers is sufficient for forming the output image based on the detected size of the original and the predetermined magnification value, the optimum output paper is selected based on which ones of the paper feed cassettes accommodate the at least two designated different output papers.

31. The image forming apparatus of claim 26, wherein when none of the at least two designated different output papers have a feed direction according with the detected feed direction, the optimum output paper is selected from the at least two designated different output papers based on the at least one selected magnification value and the detected size of the original, such that the size of the selected optimum output paper is sufficient for forming the output image.

* * * * *